(12) United States Patent
Nozaki

(10) Patent No.: US 8,395,248 B2
(45) Date of Patent: Mar. 12, 2013

(54) SEMICONDUCTOR DEVICE AND MANUFACTURING METHOD THEREFOR

(75) Inventor: Yoshiaki Nozaki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 217 days.

(21) Appl. No.: 12/726,824

(22) Filed: Mar. 18, 2010

(65) Prior Publication Data

US 2010/0244213 A1 Sep. 30, 2010

(30) Foreign Application Priority Data

Mar. 31, 2009 (JP) .................................. 2009-084913

(51) Int. Cl.
*H01L 23/495* (2006.01)

(52) U.S. Cl. ................ 257/676; 257/692; 257/E23.031; 438/121

(58) Field of Classification Search .................. 257/678, 257/676, E21.499, E23.031, 692; 438/121
See application file for complete search history.

(56) References Cited

U.S. PATENT DOCUMENTS

| | | | |
|---|---|---|---|
| 6,040,626 A * | 3/2000 | Cheah et al. .................. | 257/735 |
| 7,443,014 B2 * | 10/2008 | Otremba ....................... | 257/676 |
| 7,622,796 B2 * | 11/2009 | Shi et al. ....................... | 257/678 |
| 7,659,611 B2 * | 2/2010 | Otremba ....................... | 257/690 |
| 2001/0044167 A1 | 11/2001 | Kuo | |
| 2003/0082860 A1 | 5/2003 | Yoshida et al. | |

FOREIGN PATENT DOCUMENTS

| | | |
|---|---|---|
| JP | 59-25256 A | 2/1984 |
| JP | 11-145284 A | 5/1999 |
| JP | 2002-353269 A | 12/2002 |
| JP | 2003-163354 A | 6/2003 |
| JP | 3685659 B2 | 6/2005 |
| JP | 2007-288044 A | 1/2007 |
| JP | 2007-109880 A | 4/2007 |

* cited by examiner

*Primary Examiner* — Roy Potter
(74) *Attorney, Agent, or Firm* — Birch, Stewart, Kolasch & Birch, LLP

(57) ABSTRACT

A semiconductor device includes a lead frame 1 having a first lead 6, a second lead 7 and a third lead 8. A power transistor 2 is placed on the first lead 6, and the power transistor 2 is connected to the first lead 6. The power transistor 2 has a drain electrode on one side opposite to a first lead 6 side, and this drain electrode is connected to a Cu chip 3 on the power transistor 2. The Cu chip 3 is connected to the second lead 7 via Al wires 4. As a result, during wire bonding of the Al wires 4, it becomes possible to absorb shocks due to wire bonding by the Cu chip 3, or disperse pressure due to wire bonding by the Cu chip 3, or diffuse heat due to wire bonding by the Cu chip 3.

17 Claims, 9 Drawing Sheets

SEMICONDUCTOR DEVICE AND MANUFACTURING METHOD THEREFOR

TECHNICAL FIELD

The present invention relates to a semiconductor device, as well as a manufacturing method therefor, having a power device of GaN or the like capable of managing large currents, for example.

BACKGROUND ART

Generally, high-output, high-heat generation semiconductor devices such as power MOS (Metal Oxide Semiconductor) transistors, IGBT (Insulated-Gate Bipolar Transistors) or other power transistors as well as power ICs (Integrated Circuits) are used in every field of electronic and electrical equipment including power supplies and switches of battery-driven equipment, automobile-use electrical equipment, motor drive-use control units, and the like.

One example of conventional such high-output, high-heat generation semiconductor devices is disclosed in JP 59-25256 A (Patent Literature 1). This conventional semiconductor device, as shown in FIG. 5, includes a lead frame 51 having a header portion 54 and three lead portions 55.

The header portion 54 has a power transistor 56 mounted thereon and releases heat of the power transistor 56. The header portion 54 is provided as one unit integrated with one lead portion 55.

Electrode pads of the power transistor 56 are electrically connected to the other two lead portions 55 by wires 57. Then, the power transistor 56 is sealed together with the header portion 54 by a resin sealant 52.

Another conventional semiconductor device is disclosed in JP 3685659 B (Patent Literature 2). In this semiconductor device, as shown in FIG. 6, a protrusive electrode 62 is formed on a power transistor 63, and a lead portion 66 of a lead frame 69 is connected to the electrode 62 with solder. It is noted that numeral 68 in FIG. 6 denotes a resin sealant.

For the conventional semiconductor device of Patent Literature 1 above, the wires 57 and their junction members (electrode pads of the power transistor 56 and lead portions 55) are deformed by application of ultrasonic waves, and those members are connected to each other under the condition that oxide films present on their surfaces have been removed. However, there are fears for such adverse effects that the application of ultrasonic waves may cause an insulation film under the electrode pad to be broken or the electrode pad to be peeled off. Thus, the formation of their optimum connections necessitates condition optimization and enough process control.

Particularly, use of the wire 57 involves force concentration at an end portion of the wire 57, causing a fear for occurrence of insulation film breakdown or the like and leading to increased difficulty in setting wire-bonding conditions. Although a method using ribbon instead of the wire 57 is also available, which allows stress concentration to be reduced, yet giving ultrasonic waves to the whole ribbon may cause occurrence of a wide range of peeling. As another method for connection other than that using ultrasonic waves, the wire 57 and the electrode pad may be connected together by application of heat and pressure such as in thermo-compression bonding. In this case also, there is a fear for adverse effects such as breakdown of the dielectric layer under the electrode pad or peeling of the electrode pad or the like due to the pressure and heat.

Particularly with a structure that the insulation film on the surface of the power transistor 56 is formed of a resin which is low in adhesion with metal such as polyimide resin and which has a Young's modulus of 100 GPa or less, with the electrode pad formed on the insulation film, there arises a problem that attenuation of ultrasonic waves leads to insufficient friction between the electrode pad and the wire 57 so that the metal pad and the wire 57 are not bonded together, or a fear for a problem that increasing the power for the ultrasonic waves causes the electrode pad to be peeled from the insulation film, thus making it quite difficult to meet the required conditions. Also, in a case where the insulation film on the surface of the power transistor 56 is formed from polyimide resin while a nitride film is formed on the polyimide resin, with an improved adhesion between the polyimide resin and the electrode pad, there is a fear that the nitride film may be peeled from polyimide resin as a result of cracks that may occur to the nitride film due to deformation of the polyimide resin, which the nitride film cannot follow because the nitride film has as high a hardness as a Young's modulus of 270 GPa while polyimide resin has a Young's modulus of 27 GPa. This causes the importance of process control to be increased.

In the conventional semiconductor device of Patent Literature 2, since an electrode of thick film is formed for the formation of the protrusive electrode 62 by using semiconductor process, there is a fear for increases in manufacturing cost for the preparation of larger than 100 μm protrusions. While a method of attaching a solder ball to the surface of the power transistor 63 is also available, there is a fear for a problem of peeling of the electrode similar to that in the conventional semiconductor device of Patent Literature 1.

Moreover, connecting all the terminals on the surface of the power transistor 63 to the lead portions 66 of the lead frame 69 necessitates clearances between the lead portions 66 in order to avoid contact among the lead portions 66. This gives rise to a fear for increases in the chip size of the power transistor 63.

SUMMARY OF INVENTION

Technical Problem

Accordingly, an object of the present invention is to provide a semiconductor device, as well as a manufacturing method therefor, which can be prevented from peeling of the electrode and moreover which can be reduced in manufacturing cost.

Solution to Problem

In order to achieve the above object, there is provided a semiconductor device comprising:
a first metal plate;
a semiconductor chip which is placed on the first metal plate and connected to the first metal plate and which has a first electrode on one side opposite to the first metal plate side;
a metal piece placed on the semiconductor chip and connected to the first electrode;
a first interconnect portion having one end portion connected to the metal piece; and
a second metal plate connected to the other end portion of the first interconnect portion.

According to the semiconductor device of this constitution, when one end portion of the first interconnect portion is connected to the metal piece on the semiconductor chip by wire bonding, the metal piece has effects of absorbing shocks due to wire bonding, dispersing pressure due to wire bonding and diffusing heat due to wire bonding. As a result, it becomes possible to reduce damage of the semiconductor chip and the first electrode due to wire bonding.

Therefore, damage of the semiconductor chip and peeling of the first electrode can be prevented. Such effects can be obtained also when one end portion of the first interconnect portion is connected to the metal piece on the semiconductor chip, for example, by thermo-compression bonding.

Also, since damage of the semiconductor chip and peeling of the first electrode can be prevented, it becomes possible to facilitate the wire bonding condition setting as well as to improve the reliability of the semiconductor chip.

Further, placing the metal piece on the semiconductor chip is equivalent to placing the metal plate on the semiconductor chip, so that conventional mounting equipment can be used. That is, with use of conventional mounting equipment, the metal piece can be placed on the semiconductor chip and the first electrode can be connected to the metal piece. Then, since processes following the connection of the first electrode to the metal piece may be absolutely identical to processes of the prior art, increases in manufacturing cost can be prevented.

In one embodiment, the semiconductor chip has a second electrode on one side opposite to the first metal plate side, the semiconductor device further comprising:

a second interconnect portion having one end portion connected to the second electrode; and a third metal plate connected to the other end portion of the second interconnect portion, and wherein a distance from a metal piece side surface of the semiconductor chip to a surface of the metal piece opposite to the semiconductor chip side is larger than a height of the second interconnect portion relative to the metal piece side surface of the semiconductor chip.

According to the semiconductor device of this embodiment, a distance from the metal piece side surface of the semiconductor chip (hereinafter, referred to as "upper surface of the semiconductor chip") up to a surface of the metal piece opposite to the semiconductor chip side (hereinafter, referred to as "upper surface of the metal piece") is larger than the height of the second interconnect portion relative to the upper surface of the semiconductor chip. In other words, the height of the upper surface of the metal piece relative to the upper surface of the semiconductor chip is higher than the height of the second interconnect portion relative to the upper surface of the semiconductor chip. As a result, even if, for example, a metal plate larger than the metal piece is placed on the metal piece, damage of the second interconnect portion can be prevented by keeping the metal plate from contact with the second interconnect portion.

Also, when, for example, a metal plate larger than the metal piece is placed on the metal piece and the metal plate is connected to the metal piece, heat dissipation of the semiconductor chip can be implemented by the metal piece and the metal plate, so that heat dissipation efficiency of the semiconductor chip can be improved. As a result, reduction of on-resistance and thermal resistance of the semiconductor device can be fulfilled.

In one embodiment, the first metal plate, the second metal plate and the third metal plate are each part of a lead frame, and a control IC for controlling the semiconductor chip and a diode electrically connected to the semiconductor chip are mounted on the lead frame.

According to the semiconductor device of this embodiment, since the first metal plate, the second metal plate and the third metal plate are each part of the lead frame, mounting a driver IC or a diode or the like as an example on the lead frame and using part of the lead frame as an interconnect portion for flow of large currents makes it possible to implement a compact IPM (Intelligent Power Module) and reduce the inductance due to interconnections.

In particular, the parasitic inductance can be minimized when a semiconductor chip on which a drain electrode and a gate electrode are provided on one same side is connected on the top surface of the lead frame and moreover a semiconductor chip on which a source electrode and a gate electrode are provided on one same side is connected on the bottom surface of the lead frame.

In one embodiment, the semiconductor chip has:

a main body formed from a semiconductor;

a third electrode provided on a metal piece side surface of the main body;

an insulation film formed of resin and provided on the metal piece side surface of the main body;

a first through hole extending from a metal piece side surface of the insulation film up to the third electrode; and an electroconductive member formed in the first through hole, wherein the first electrode is provided on the insulation film and electrically connected to the third electrode via the electroconductive member in the first through hole.

According to the semiconductor device of this embodiment, since the third electrode is connected to the first electrode via the electroconductive member within the first through hole, any increase in the placement area of the semiconductor chip can be prevented by eliminating pull-out of the electrodes in a sideway direction of the main body. It is noted here that the term "sideway direction" refers to a direction parallel to the metal piece side surface of the main body.

Further, in this semiconductor device, since the third electrode provided on the insulation film is connected to the first electrode via the electroconductive member within the first through hole, the semiconductor device can be provided as a lateral device.

Further, when the semiconductor device is a nitride semiconductor field effect transistor as an example, drain-gate, drain-source capacitances can be reduced so that higher-speed operations become implementable.

The nitride semiconductor field effect transistor is a lateral device, and the drain electrode, the source electrode and the gate electrode are all provided on one side of the semiconductor chip. Thus, the chip area resulting when the pull-out of all of the drain electrode, the source electrode and the gate electrode is effected toward one side of the semiconductor chip becomes a double or more of a chip area resulting when pull-out of all of the drain electrode and the gate electrode is done toward one side of the semiconductor chip and moreover pull-out of the source electrode is done toward the other side of the semiconductor chip. Therefore, although any increase in chip area can be prevented when pull-out of all of the drain electrode and the gate electrode is done toward one side of the semiconductor chip and moreover pull-out of the source electrode is done toward the other side of the semiconductor chip, yet high voltages beyond 400 V are applied to the drain electrode, giving rise to a need for providing an insulation film formed from resin and having a film thickness of several μm (e.g., 5 μm) on the metal piece side surface of the main body for the purposes of insulation securement of the gate electrode and the source electrode from the drain electrode as well as reduction in parasitic capacitance.

The insulation film may be one formed from polyimide as an example. Although an insulation film formed from polyimide is capable of being patterned and best suited for semiconductor manufacturing processes, yet electrodes formed of metal film would be easily peeled due to poor adhesion between polyimide and metal film.

Accordingly, in this semiconductor device, the first electrode is provided on the insulation film and connected to the third electrode via the electroconductive member within the first through hole provided in the insulation film, so that the first electrode is not easily peeled off.

An organic material as an example may be used as the material of the insulation film.

In one embodiment, the semiconductor chip has:

an inorganic insulation film provided on the insulation film;

a second through hole extending from a metal piece side surface of the inorganic insulation film toward the third electrode and communicating with the first through hole; and an electroconductive member formed in the second through hole, wherein the first electrode is provided on the inorganic insulation film and electrically connected to the third electrode via the electroconductive members in the first and second through holes.

According to the semiconductor device of this embodiment, by the first electrode being provided on the inorganic insulation film, even if the insulation film is an organic insulation film of polyimide or the like, the inorganic insulation film is sandwiched between the organic insulation film and the first electrode, so that adhesion between the organic insulation film and the first electrode can be improved.

In one embodiment, the semiconductor chip includes a nitride semiconductor.

According to the semiconductor device of this embodiment, since the semiconductor chip includes a nitride semiconductor, high-withstand-voltage, high-speed switching characteristics can be fulfilled.

In another aspect of the invention, there is provided a semiconductor device manufacturing method for manufacturing the semiconductor device of the invention, comprising the steps of:

placing the semiconductor chip on the first metal plate and connecting the semiconductor chip to the first metal plate;

placing the metal piece on the semiconductor chip and connecting the metal piece to the first electrode; and connecting the metal piece and the second metal plate to each other via the first interconnect portion.

According to the semiconductor device manufacturing method of this invention, since the metal piece and the second metal plate are connected to each other via the first interconnect portion, shocks due to the connection of the first interconnect portion can be absorbed by the metal piece, pressure due to the connection of the first interconnect portion can be dispersed by the metal piece, and heat due to the connection of the first interconnect portion can be diffused by the metal piece. As a result, damage of the semiconductor chip and the first electrode during wire bonding can be reduced.

Therefore, damage of the semiconductor chip and peeling of the first electrode can be prevented. Such effects can be obtained also when wire bonding, thermo-compression bonding or the like is adopted for the connection of the first interconnect portion.

Further, since damage of the semiconductor chip and peeling of the first electrode can be prevented, the reliability of the semiconductor chip can be improved.

Furthermore, since the placement of the metal piece onto the semiconductor chip can be implemented by conventional mounting equipment, increases in manufacturing cost can be prevented.

In one embodiment, the first interconnect portion is at least one wire, and the connection of the metal piece and the second metal plate to each other is implemented by wire bonding.

According to the semiconductor device manufacturing method of this embodiment, since the connection of the metal piece and the second metal plate to each other is fulfilled by wire bonding, time required for the connection can be shortened.

Advantageous Effects of Invention

According to the semiconductor device of the invention, the metal piece is placed on the first electrode of the semiconductor chip and connected to the first electrode and moreover one end portion of the first interconnect portion is connected to the metal piece. Thus, thermal and mechanical damage of the semiconductor chip and the first electrode can be reduced during the connection of one end portion of the first interconnect portion.

Therefore, damage of the semiconductor chip and peeling of the first electrode can be prevented.

Further, since damage of the semiconductor chip and peeling of the first electrode can be prevented, the reliability of the semiconductor chip can be improved.

Furthermore, since the placement of the metal piece onto the semiconductor chip can be implemented by conventional mounting equipment, increases in manufacturing cost can be prevented.

According to the semiconductor device manufacturing method of the invention, the metal piece is placed on the semiconductor chip and connected to the first electrode, and moreover the metal piece and the second metal plate are connected to each other via the first interconnect portion. Thus, during this connection, thermal and mechanical damage of the semiconductor chip and the first electrode can be reduced.

Therefore, damage of the semiconductor chip and peeling of the first electrode can be prevented.

Further, since damage of the semiconductor chip and peeling of the first electrode can be prevented, the reliability of the semiconductor chip can be improved.

Furthermore, since the placement of the metal piece onto the semiconductor chip can be implemented by conventional mounting equipment, increases in manufacturing cost can be prevented.

BRIEF DESCRIPTION OF DRAWINGS

The present invention will become more fully understood from the detailed description given hereinbelow and the accompanying drawings which are given by way of illustration only, and thus are not intended to limit the present invention, and wherein.

DESCRIPTION OF EMBODIMENTS

Hereinbelow, the semiconductor device of the present invention will be described in detail by embodiments thereof illustrated in the accompanying drawings.

First Embodiment

Figure 1A:
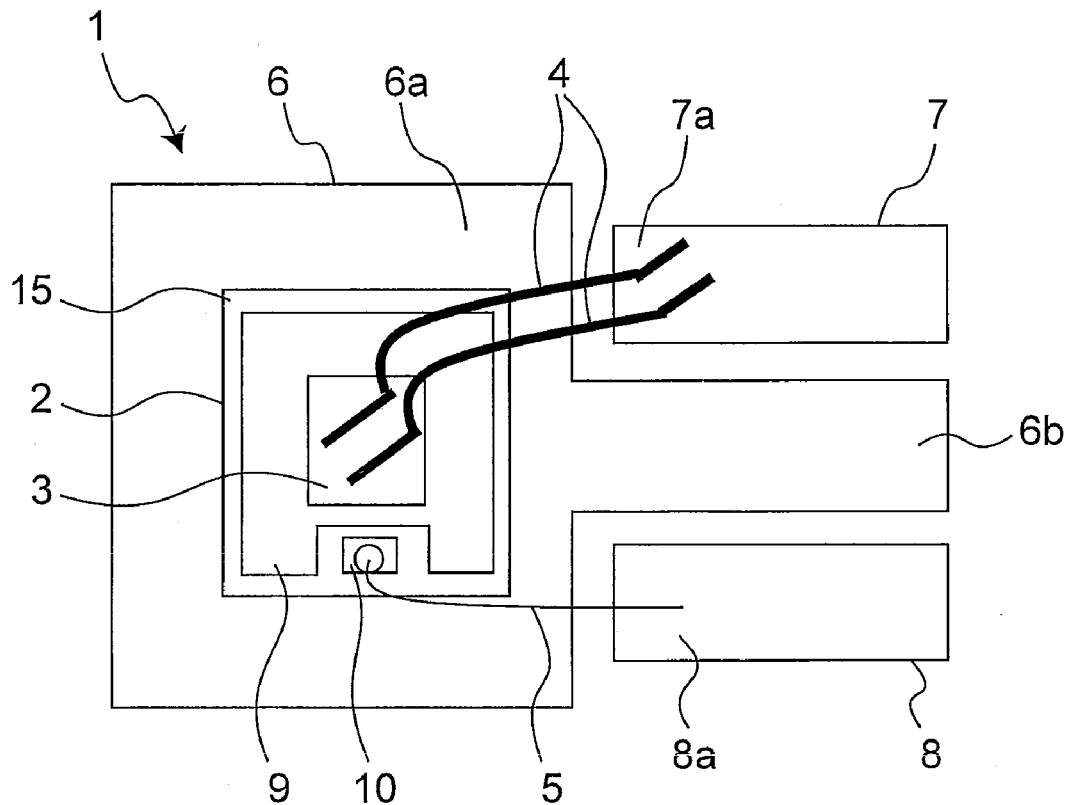
FIG. 1A is a schematic plan view of a semiconductor device according to a first embodiment of the present invention.
Figure 1B:
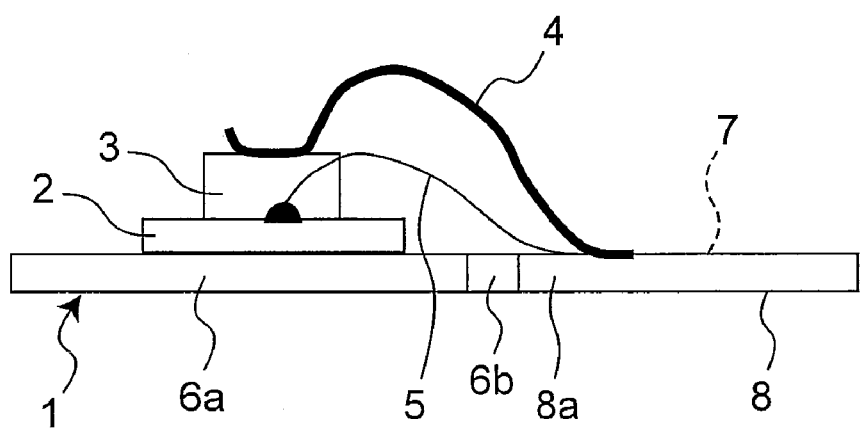
FIG. 1B is a schematic side view of the semiconductor device of the first embodiment.

FIG. 1A is a schematic view of a semiconductor device according to a first embodiment of the invention as viewed from the top. FIG. 1B is a schematic view of the semiconductor device as viewed sideways.

The semiconductor device, as shown in FIGS. 1A and 1B, includes a metallic lead frame 1, a power transistor 2 set on the lead frame 1, and a Cu chip 3 set on the power transistor 2. Although not shown, the power transistor 2, the Cu chip 3, and part of the lead frame 1 are sealed with resin. It is noted that the power transistor 2 is an example of the semiconductor chip. The Cu chip 3 is an example of the metal piece.

The lead frame 1 has a first lead 6, a second lead 7, and a third lead 8, where the first lead 6, the second lead 7 and the third lead 8 are all metallic made. Also, the first lead 6 is composed of a rectangular-plate shaped source terminal 6a to which a lower surface of the power transistor 2 is connected, and a lead portion 6b extending contiguous to the source terminal 6a. Then, the second lead 7 and the third lead 8 extend each along the lead portion 6b. Also, a drain terminal 7a is provided at a source-terminal 6a side end portion of the second lead 7, while a gate terminal 8a is provided at a source-terminal 6a side end portion of the third lead 8. It is noted that the first lead 6 is an example of a first metal plate, the second lead 7 is an example of a second metal plate and the third lead 8 is an example of a third metal plate.

A drain electrode 9 is provided on an upper surface (a surface on the Cu chip 3 side) of the power transistor 2. A lower surface (a surface on the power transistor 2 side) of the Cu chip 3 is connected to the drain electrode 9. Also, end portions of Al wires 4 are electrically connected to the upper surface (a surface opposite to the power transistor 2 side surface) of the Cu chip 3. Then, the other end portions of the Al wires 4 are electrically connected to the drain terminal 7a of the second lead 7. That is, the drain electrode 9 conducts to the drain terminal 7a of the second lead 7 via the Cu chip 3 and the Al wires 4. It is noted that the drain electrode 9 is an example of a first electrode and the Al wires 4 are an example of a first interconnect portion.

A gate electrode 10 is exposed on the upper surface of the power transistor 2, and the gate electrode 10 is electrically connected to the gate terminal 8a of the third lead 8 via an Au wire 5. It is noted that the gate electrode 10 is an example of a second electrode and the Au wire 5 is an example of a second interconnect portion.

Figure 1C:
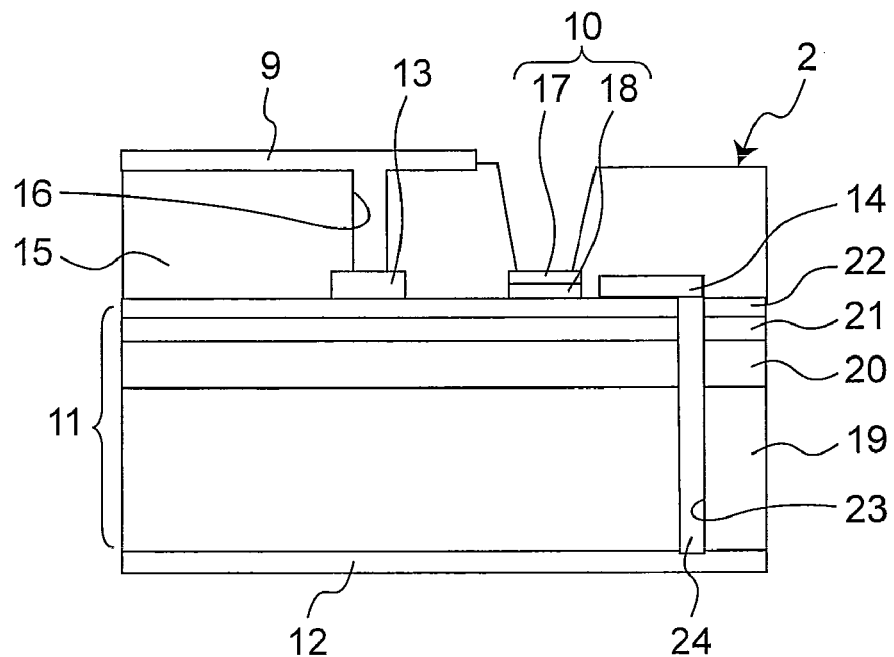
FIG. 1C is a schematic sectional view of a power transistor in the first embodiment.

FIG. 1C is a schematic sectional view of the power transistor 2.

The power transistor 2 includes a power device section 11, a source electrode 12 provided over a whole lower surface (a surface on the first lead 6 side) of the power device section 11, a gate electrode 10, a drain-use ohmic electrode 13 and a source-use ohmic electrode 14, which are provided on the upper surface (a surface on the Cu chip 3 side) of the power device section 11, and a polyimide film 15 covering most portion of the upper surface of the power device section 11. The source electrode 12 is connected to the source terminal 6a of the first lead 6. The drain electrode 9 is placed on the polyimide film 15. It is noted that the power device section 11 is an example of a device main body, the drain-use ohmic electrode 13 is an example of a third electrode and the polyimide film 15 is an example of an insulation film made of resin.

In the power device section 11, a buffer layer 20, a GaN layer 21 and an AlGaN layer 22 are formed on a Si substrate 19 through epitaxial growth process by using MOCVD (Metal Organic Chemical Vapor Deposition).

Both the drain-use ohmic electrode 13 and the source-use ohmic electrode 14 are Ti/Au metal films.

The gate electrode 10 is composed of an upper gate electrode 17 and a lower gate electrode 18. The upper gate electrode 17 is formed of a Ti/Ni/Au metal film. The lower gate electrode 18, on the other hand, is formed of a Pt/Au metal film.

A drain-use through hole 16 is provided in the polyimide film 15. The drain-use through hole 16 extends in a layer-stacking direction from the upper surface (a surface on the Cu chip 3 side) of the polyimide film 15 up to the drain-use ohmic electrode 13. Part of the drain electrode 9 is formed in the drain-use through hole 16 so that the drain electrode 9 is connected to the drain-use ohmic electrode 13. It is noted that the drain-use through hole 16 is an example of a first through hole. In the drain-use through hole 16, an electroconductive member formed from a material other than that of the drain electrode 9 may be provided. It is also possible that while an electroconductive member formed from an electroconductive material other than that of the drain electrode 9 is provided in the drain-use through hole 16, the electroconductive member is connected to the drain electrode provided on the upper surface of the polyimide film 15.

Further, a source-use through hole 23 is provided in the power device section 11. The source-use through hole 23 extends in the layer-stacking direction from the lower surface of the power device section 11 up to the source-use ohmic electrode 14. A through electrode 24 is formed in the source-use through hole 23. As a result of this, the source-use ohmic electrode 14 is connected to the source electrode 12 via the through electrode 24.

Now a manufacturing method of the semiconductor device described above is explained below.

First, a 2.5 mm☐ and 0.1 mm thick solder is placed on a source terminal 6a of the first lead 6, and a power transistor 2 having a 2 mm☐ lower surface is placed on the solder. As a result, the source electrode 12 of the power transistor 2 is electrically connected to the source terminal 6a of the first lead 6.

Next, a 250 μm thick Cu chip 3 having a 1.5 mm☐ lower surface is placed on the drain electrode 9 of the power transistor 2. The lower surface of the Cu chip 3 to face the drain electrode 9 is preparatorily solder-plated before mounting. Meanwhile, the upper surface of the Cu chip 3 is preparatorily Au-plated before mounting.

Next, after the Cu chip 3 mounted on the drain electrode 9 is subjected to solder reflow at 280° C., one 25 μm-in-dia. Au wire 5 is bonded between the gate 10 and the gate terminal 8a while two 400 μm-in-dia. Al wires 4 are bonded between the Cu chip 3 and the drain terminal 7a.

After that, through mounting processes such as ordinary resin molding process, which are not shown, the semiconductor device is completed.

As a result of manufacturing the semiconductor device by the method described above, there occurred no peeling of the drain electrode 9 during the wire bonding.

Also, before the resin molding process, products were partly sampled and subjected to a pull test of the Al wires 4. As a result of this, a wire-pull load of more than 800 g was obtained, whereas only a wire-pull load of 100 g was obtained with direct wire bonding to the drain electrode 9.

Also, as to the setting of wire bonding conditions, when direct wire bonding to the drain electrode 9 is adopted, ultrasonic power needs to be set to 1.0 to 1.2 (device set value). While damage on the metal film was found with the ultrasonic power set higher than this, this first embodiment showed no damage on the metal film even with the ultrasonic power set to 3 to 5 (device set value), enabling stronger settings for ultrasonic waves as well as a wider range of conditions for wire bonding.

Also, since the mounting of the Cu chip 3 onto the power transistor 2 can be done by conventional mounting equipment, increases in the manufacturing cost can be prevented.

Also, when a Ti/NI/Au metal film is formed on the polyimide film 15 via a 200 nm thick SiN film, followed by direct wire bonding to the metal film, the manufactured device comes to withstand a wire-pull load of 300 g, while a required strength cannot be obtained.

In contrast to this, in this first embodiment, since a wire-pull load of 800 g or more can be obtained with the Al wires 4, use of a SiN film having a film thickness of 200 nm allows further quality improvement to be obtained.

In the first embodiment, a power transistor 2 of GaN/AlGaN normally-ON type structure is used. Alternatively, a power transistor of GaN/AlGaN normally-OFF type structure, a power device using nitride semiconductors other than GaN/AlGaN, an IGBT or a power MOS transistor of a Si device may also be used. With use of the Si device, a leadframe 1 side electrode of the Si device serves as a drain electrode, while a Cu chip 3 side electrode of the Si device serves as a source electrode.

It is also possible that the power MOS transistor is made according to a first-half process flow of ordinary Si device manufacture, where a Ti/Ni/Au drain electrode is formed over the whole lower surface of the power MOS transistor while Al—Si(1%)/Ti/NI/Au gate electrode and source electrode are formed on the upper surface of the power MOS transistor.

Figure 1D:
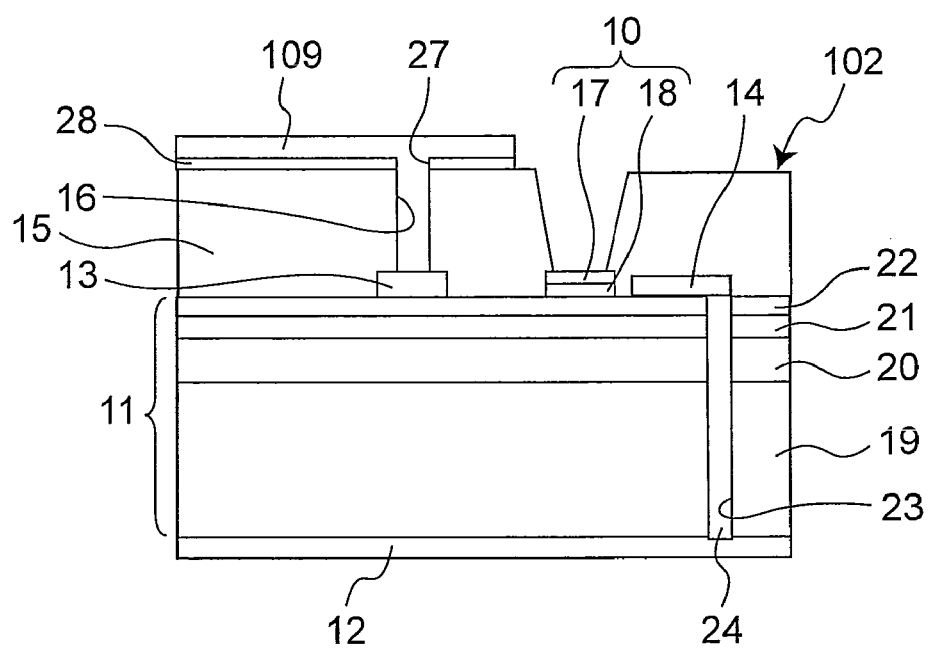
FIG. 1D is a schematic sectional view a modification of the power transistor.

Although the power transistor 2 is placed on the first lead 6 in the first embodiment, a power transistor 102 shown in FIG. 1D may be placed.

The power transistor 102 differs from the power transistor 2 only in that the power transistor 102 includes an inorganic insulation film 28 having a drain-use through hole 27 and a drain electrode 109 provided on the inorganic insulation film 28. The drain electrode 109 is formed partly in the drain-use through hole 16, 27. As a result, the drain electrode 109 is connected to the drain-use ohmic electrode 13. It is noted that the power transistor 102 is an example of the semiconductor chip. Also, the drain-use through hole 27 is an example of a second through hole. In the drain-use through hole 16, 27, an electroconductive member formed from a material other than that of the drain electrode 109 may be formed.

As shown above, since the inorganic insulation film 28 is interposed between the drain electrode 109 and the polyimide film 15, adhesion between the drain electrode 109 and the polyimide film 15 can be improved.

In the case where the power transistor 102 is placed on the first lead 6, the drain electrode 109 is connected to the lower surface of the Cu chip 3, while the source electrode 12 is electrically connected to the first lead 6.

In addition, a concrete example of the inorganic insulation film 28 is a silicon nitride film, silicon oxide film or the like.

Second Embodiment

Figure 2A:
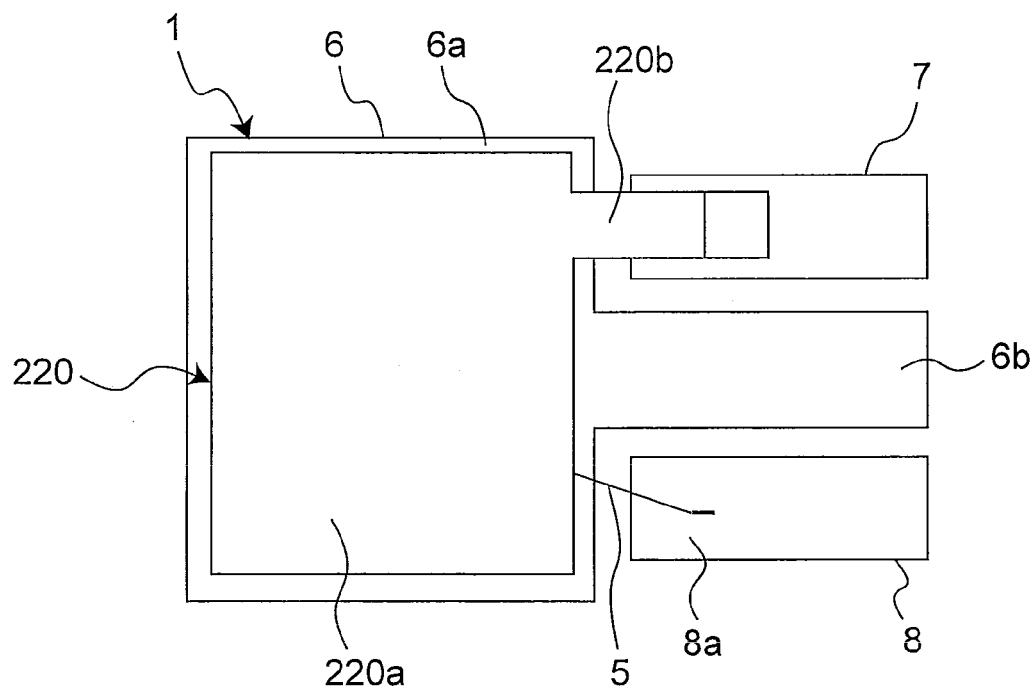
FIG. 2A is a schematic plan view of a semiconductor device according to a second embodiment of the present invention.
Figure 2B:
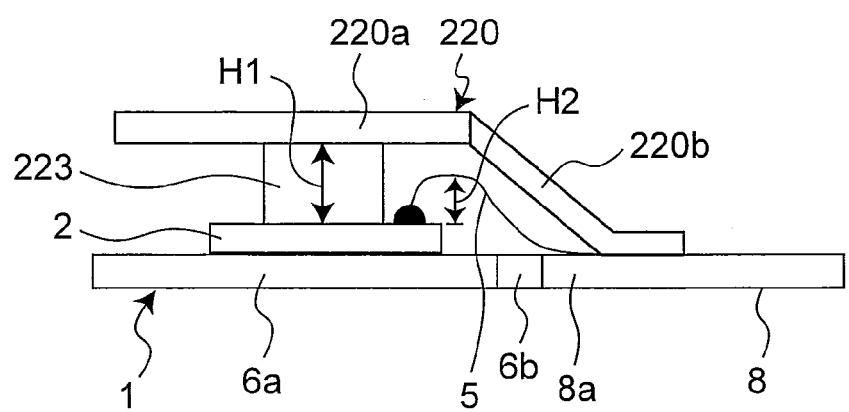
FIG. 2B is a schematic side view of the semiconductor device of the second embodiment.
Figure 2C:
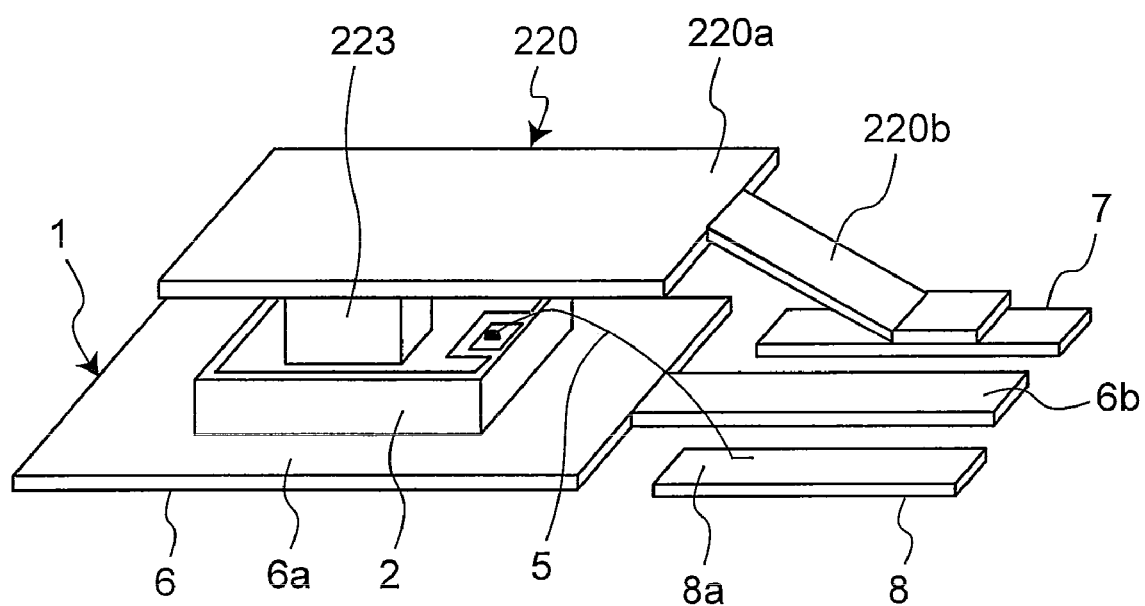
FIG. 2C is a schematic perspective view of the semiconductor device of the second embodiment.

FIG. 2A is a schematic view of a semiconductor device according to a second embodiment of the invention, as viewed from the top. FIG. 2B is a schematic view of the semiconductor device as viewed sideways. FIG. 2C is a schematic view of the semiconductor device as viewed from a diagonal top. In FIGS. 2A to 2C, the same component members as those of the first embodiment shown in FIGS. 1A to 1C are designated by the same reference signs as those of the component members in FIGS. 1A to 1C and their description is omitted. FIGS. 1A to 1C are incorporated hereinbelow, if necessary.

The semiconductor device, as shown in FIGS. 2A, 2B and 2C, includes a Cu chip 223 placed on a power transistor 2, and a lead frame 220 formed of Cu and placed on the Cu chip 223. The Cu chip 223 differs from the Cu chip 3 of the first embodiment only in its height. More specifically, a distance from the upper surface of the power transistor 2 to the upper surface of the Cu chip 223, i.e. a height H1 of the Cu chip 223, is set larger than a height H2 of the Au wire 5 relative to the upper surface of the power transistor 2. It is noted here that the height H2 of the Au wire 5 refers to a height of the highest portion relative to the upper surface of the power transistor 2. It is noted that the lead frame 220 is an example of the first interconnect portion. Also, the Cu chip 223 is an example of the metal piece.

The lead frame 220 has a rectangular plate-shaped bonding portion 220a, and a lead portion 220b extending contiguous to the bonding portion 220a. Lower and upper surfaces of the bonding portion 220a are set larger in area than the upper surface of the Cu chip 223. Also, the bonding portion 220a is electrically connected to the Cu chip 223, while a front end portion (an end portion opposite to the bonding portion 220a side end portion) of the lead portion 220b is electrically connected to the second lead 7. As a result, the drain electrode 9 of the power transistor 2 conducts to the second lead 7 via the Cu chip 223 and the lead frame 220.

Now a manufacturing method of the semiconductor device described above is explained below.

First, a 2.5 mm☐ and 0.1 mm thick solder is placed on a source terminal 6a of the first lead 6, and a power transistor 2 having a 2 mm☐ lower surface is placed on the solder. As a result, the source electrode 12 of the power transistor 2 is electrically connected to the source terminal 6a of the first lead 6.

Next, a 2 mm thick Cu chip 223 having a 1.5 mm□ lower surface is placed on the drain electrode 9 of the power transistor 2. The lower surface of the Cu chip 223 to face the drain electrode 9 is preparatorily solder-plated before mounting. Meanwhile, the upper surface of the Cu chip 223 is also preparatorily solder-plated before mounting.

Next, after the Cu chip 223 mounted on the drain electrode 9 is subjected to solder reflow, one 25 μm-in-dia. Au wire 5 is bonded between the gate 10 and the gate terminal 8a.

Next, 1 mm□ and 0.1 mm thick solder is applied onto the upper surface of the Cu chip 223, while 2 mm□ and 0.1 mm thick solder is applied onto the second lead 7. Thereafter, the bonding portion 220a of the lead frame 220 is connected to the upper surface of the Cu chip 223, while a front end portion of the lead portion 220b is connected to the second lead 7, followed by reflow process. As a result, the bonding portion 220a of the lead frame 220 is joined to the upper surface of the Cu chip 223, while the front end portion of the lead portion 220b is joined to the second lead 7. In this case, for example, a connecting portion between the bonding portion 220a of the lead frame 220 and the Cu chip 223 is so assumed as to have a size of 3 mm×5 mm.

After that, through mounting processes such as ordinary resin molding process, which are not shown, the semiconductor device is completed.

As shown above, the bonding portion 220a of the lead frame 220 is positioned on the Cu chip 223. However, since the height H1 of the Cu chip 223 is higher than the height H2 of the Au wire 5 relative to the upper surface of the power transistor 2, the Au wire 5 can be prevented from being damaged by the bonding portion 220a during the positioning of the bonding portion 220a onto the Cu chip 223.

Also, since the bonding portion 220a of the lead frame 220 can dissipate heat of the power transistor 2 received via the Cu chip 223, the heat dissipation efficiency of the power transistor 2 can be improved. As a result, a reduction effect of on-resistance and thermal resistance of the power transistor 2 can be obtained.

Also, use of the lead frame 220 makes it possible to lower the thermal resistance to ⅔ and lower the lead resistance to ½.

In the second embodiment, a power transistor 2 of GaN/AlGaN normally-ON type structure is used. Alternatively, a power transistor of GaN/AlGaN normally-OFF type structure, a power device using nitride semiconductors other than GaN/AlGaN, an IGBT or a power MOS transistor of a Si device may also be used. With use of the Si device, a lead frame 1 side electrode of the Si device serves as a drain electrode, while a Cu chip 3 side electrode of the Si device serves as a source electrode.

It is also possible that the power MOS transistor is made according to a first-half process flow of ordinary Si device manufacture, where a Ti/Ni/Au drain electrode is formed over the whole lower surface of the power MOS transistor while Al—Si(1%)/Ti/Ni/Au gate electrode and source electrode are formed on the upper surface of the power MOS transistor.

The semiconductor device is manufactured by using the lead frame 220 and the second lead 7 provided separate from the lead frame 220 in the second embodiment. Alternatively, the semiconductor device may be manufactured by using an integral unit of the lead frame 220 and the second lead 7.

Third Embodiment

Figure 3A:
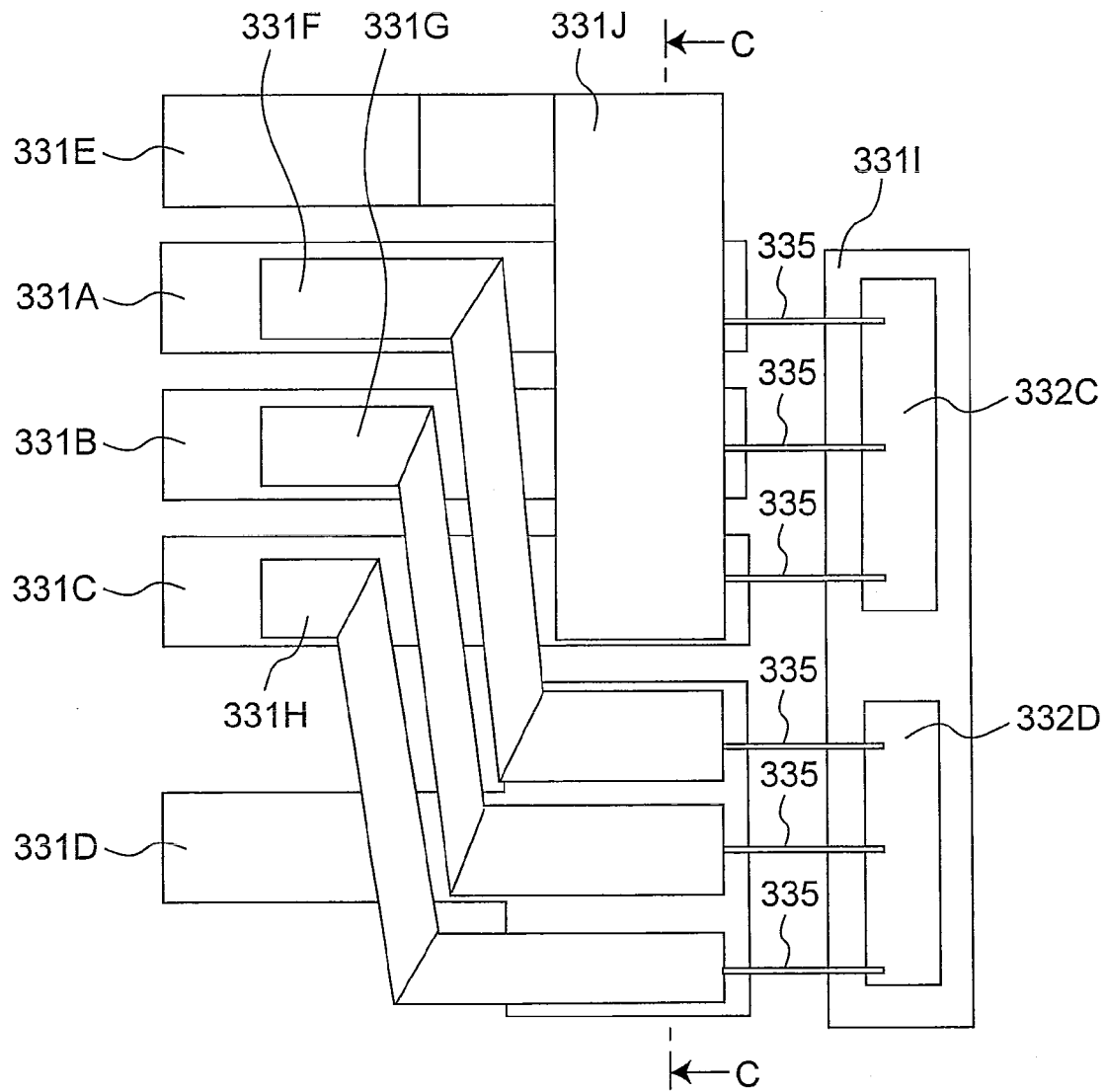
FIG. 3A is a schematic plan view of a semiconductor device according to a third embodiment of the present invention.
Figure 3B:
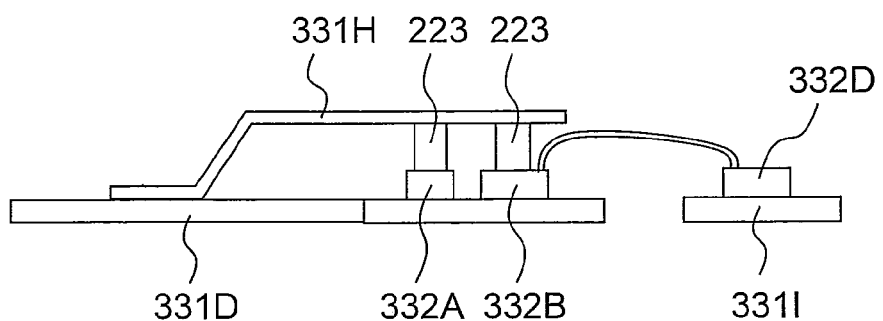
FIG. 3B is a schematic side view of the semiconductor device of the third embodiment.
Figure 3C:
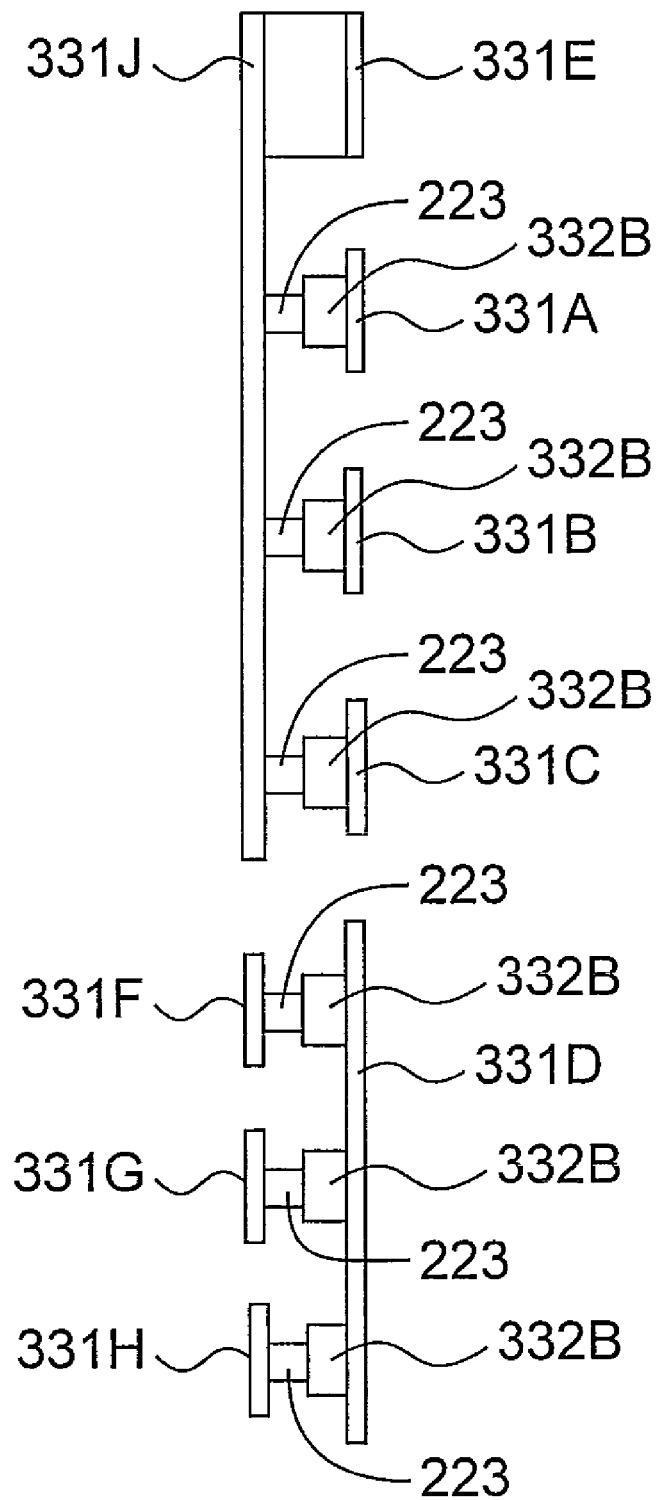
FIG. 3C is a schematic sectional view taken along a line C-C of FIG. 3A.

FIG. 3A is a schematic view of a semiconductor device according to a third embodiment of the invention, as viewed from the top. FIG. 3B is a schematic view of the semiconductor device as viewed sideways. FIG. 3C is a sectional view of the semiconductor device taken along the line C-C of FIG. 3A. In FIGS. 3B and 3C, the same component members as those of the second embodiment shown in FIGS. 2B and 2C are designated by the same reference signs as those of the component members in FIGS. 2B and 2C and their description is omitted.

The semiconductor device, as shown in FIGS. 3A, 3B and 3C, is an IPM (Intelligent Power Module) including lead frames 331A-331J, a diode 332A, an IGBT 332B, a low-side control IC 332C, and a high-side control IC 332D. Also, although not shown, diodes 332A are placed also on the lead frames 331A, 331B, 331C. It is noted that the lead frames 331A-331D are each an example of the first metal plate. Moreover, the lead frames 331A, 331B, 331C are each an example of the second metal plate as well. The lead frame 331E is an example of the second metal plate. The lead frame 331I is an example of the third metal plate. The lead frames 331F, 331G, 331H, 331J are each an example of the first interconnect portion. The low-side control IC 332C and the high-side control IC 332D are each an example of control ICs.

In upper surfaces (chip mounting surfaces) of the lead frames 331A, 331B, 331C, 1.5 mm□ and 0.1 mm thick solder is placed at portions of those surfaces to which the diode 332A is to be connected. Moreover, 2.5 mm□ and 0.1 mm thick solder is placed at portions to which the IGBT 332B is to be connected, and then junction of the diode 332A and the IGBT 332B to the lead frames 331A, 331B, 331C is performed.

On the lead frame 331D, three sets of the diode 332A and the IGBT 332B are mounted. That is, three diodes 332A and three IGBTs 332B are joined to the lead frame 331D. This junction is performed by solder application and reflow onto the upper surface of the lead frame 331D.

A high-side control IC 332D side end portion of each of the lead frames 331F, 331G, 331H has a width of 2 mm.

The diode 332A, the IGBT 332B, the low-side control IC 332C and the high-side control IC 332D are positioned flush with one another. The diode 332A has 1 mm□ upper and lower surfaces, and the IGBT 332 has 2 mm□ upper and lower surfaces.

On the upper surface of every IGBT 332B, a Cu chip 223 is mounted with 1.8 mm□ and 0.1 mm thick solder interposed therebetween. The upper and lower surfaces of the Cu chip 223 are plated with 1.5 mm□ and 2 mm thick solder before mounting.

Also, the Cu chip 223 is mounted on the upper surface of every diode 332A with 0.8 mm□ and 0.1 mm thick solder interposed therebetween. The upper and lower surfaces of the Cu chip 223 are plated with 0.7 mm□ and 2 mm thick solder before mounting.

Also, a lower surface of a high-side control IC 332D side end portion of each of the lead frames 331F, 331G, 331H is preparatorily solder-plated. The high-side control IC 332D side end portions of the lead frames 331F, 331G, 331H are placed on the upper surface of the Cu chip 223, and joined to the upper surface of the Cu chip 223 by laser heating.

The low-side control IC 332C and the high-side control IC 332D are joined to the lead frame 331I with Ag paste.

Also, control electrodes of the low-side control IC 332C and the high-side control IC 332D are wire-bonded to the gate electrodes of the IGBTs 332B with 25 μm-in-dia. Au wire 335. It is noted that the Au wire 335 is an example of the second interconnect portion. Also, the gate electrode of each IGBT 332B is an example of the second interconnect portion.

The semiconductor device constructed as described above has effects similar to those of the first and second embodiments and moreover is enabled to reduce the interconnect inductance from 7 nH of Al wire to 5 nH, showing a 30% reduction of surge voltage as compared with the case of Al wire interconnection.

Besides, mounting processes such as ordinary resin molding process may be performed also for the semiconductor device described above.

Fourth Embodiment

Figure 4A:
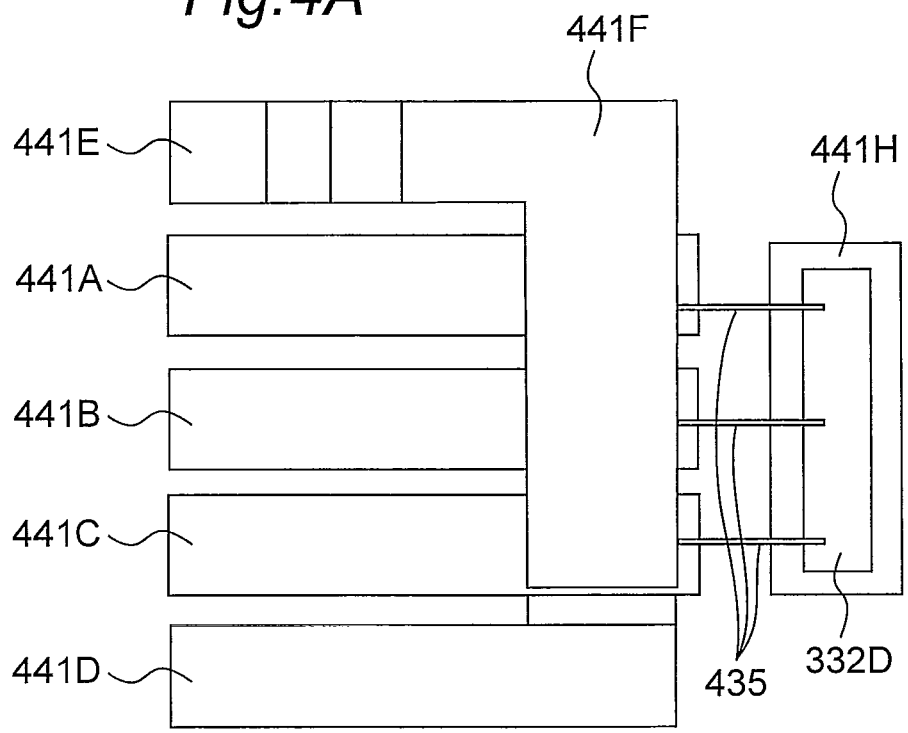
FIG. 4A is a schematic plan view of a semiconductor device according to a fourth embodiment of the present invention.
Figure 4B:
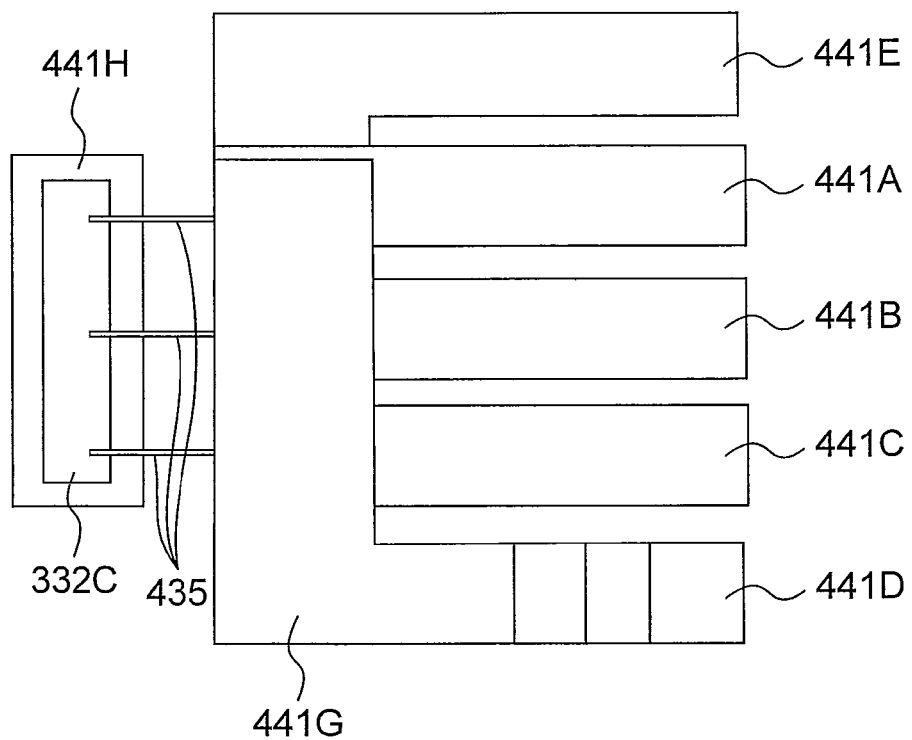
FIG. 4B is a schematic bottom view of the semiconductor device of the fourth embodiment.
Figure 4C:
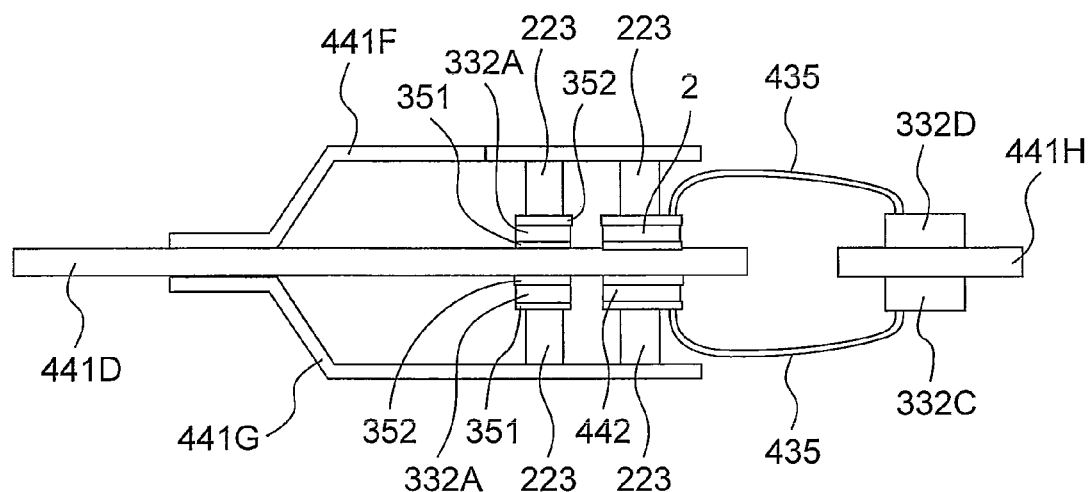
FIG. 4C is a schematic side view of the semiconductor device of the fourth embodiment.

FIG. 4A is a schematic view of a semiconductor device according to a fourth embodiment of the invention, as viewed from the top. FIG. 4B is a schematic view of the semiconductor device as viewed from the bottom. FIG. 4C is a schematic view of the semiconductor device as viewed sideways. In FIG. 4C, the same component members as those of the first, second and third embodiments shown in FIGS. 1B, 2B and 3B are designated by the same reference signs as those of the component members in FIGS. 1B, 2B and 3B and their description is omitted.

The semiconductor device, as shown in FIGS. 4A-4C, includes lead frames 441A, 441B, . . . , 441H, a power transistor 442, a low-side control IC 332C, and a high-side control IC 332D. It is noted that the lead frames 441A, 441B, 441C are each an example of the first metal plate. Moreover, the lead frames 441D, 441E are each an example of the second metal plate. The lead frames 441F, 441G are each an example of the first interconnect portion. The power transistor 442 is an example of the semiconductor chip.

A source electrode 12 (see FIG. 1C) of the power transistor 2 having 1 mm☐ upper and lower surfaces and an anode 351 of a diode 332A having 1 mm☐ upper and lower surfaces are connected to upper surfaces of the lead frames 441A, 441B, 441C with Ag paste. The lower surface of the Cu chip 223 is connected to upper surfaces of the power transistor 2 and the diode 332A with Ag paste. More specifically, the drain electrode 9 of the power transistor is electrically connected the lower surface of the Cu chip 223. Meanwhile, a cathode 352 of the diode 332A is electrically connected to the lower surface of the Cu chip 223. The upper and lower surfaces of the Cu chip 223 are plated with 0.7 mm☐ and 2 mm thick solder before mounting of the Cu chip 223 onto the upper surfaces of the power transistor 2 and the diode 332A.

The connection of the Cu chip 223 to the upper surfaces of the power transistor 2 and the diode 332A is performed by laser heating of the lead frame 441F effected from the high-side control IC 332D side.

Meanwhile, a drain electrode 409 (see FIG. 4D) of the power transistor 442 having 1 mm☐ upper and lower surfaces and a cathode 352 of a diode 332A having 1 mm☐ upper and lower surfaces are connected to upper surfaces of the lead frames 441A, 441B, 441C with Ag paste. The upper surface of the Cu chip 223 is connected to lower surfaces of the power transistor 442 and the diode 332A with Ag paste. More specifically, the source electrode 412 of the power transistor 442 is electrically connected to the upper surface of the Cu chip 223. Meanwhile, an anode 351 of the diode 332A is electrically connected to the upper surface of the Cu chip 223. The upper and lower surfaces of the Cu chip 223 are plated with 0.7 mm☐ and 2 mm thick solder before mounting of the Cu chip 223 onto the lower surfaces of the power transistor 442 and the diode 332A. It is noted that the drain electrode 409 is an example of the first electrode.

The connection of the Cu chip 223 to the lower surfaces of the power transistor 442 and the diode 332A is performed by laser heating of the lead frame 441G effected from the low-side control IC 332C side.

The high-side control IC 332D is fixed to the upper surface of the lead frame 441H with Ag paste, while the low-side control IC 332C is fixed to the lower surface of the lead frame 441H with Ag paste. The high-side control IC 332D is electrically connected to the gate electrode 1 (see FIG. 1C) of the power transistor 2 with an Au wire 435. On the other hand, the low-side control IC 332C is electrically connected to a gate electrode 410 (see FIG. 4D) of the power transistor 442 with the Au wire 435. It is noted that the Au wire 435 is an example of the second interconnect portion.

Figure 4D:
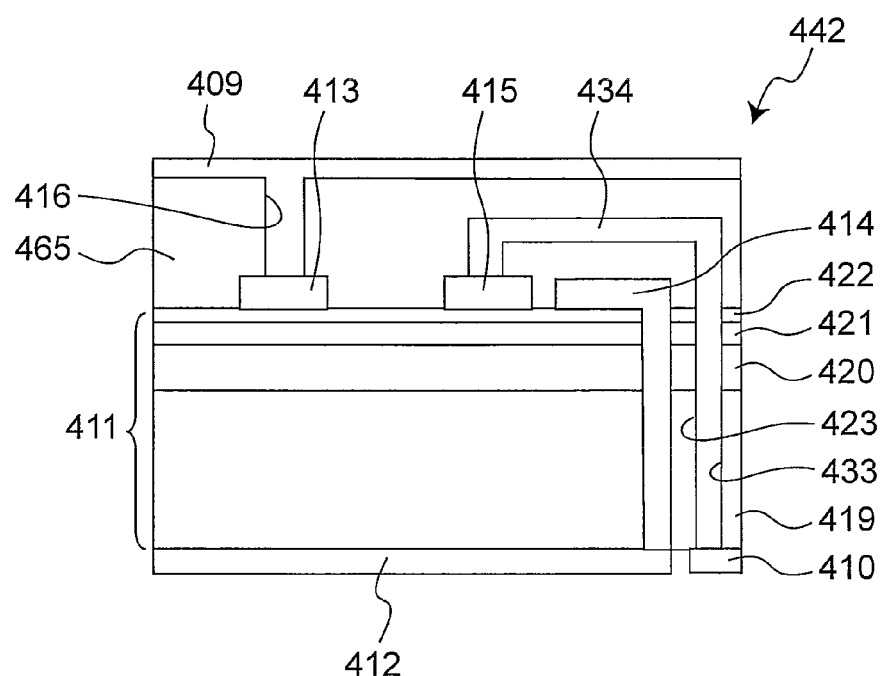
FIG. 4D is a schematic sectional view of a power transistor in the fourth embodiment.
Figure 5:
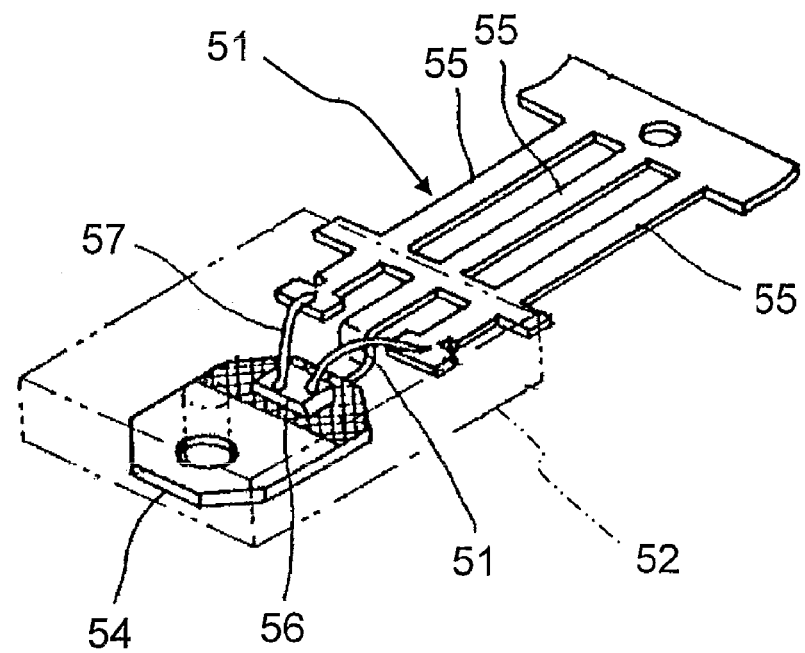
FIG. 5 is an outline perspective view of a semiconductor device according to a prior art.
Figure 6:
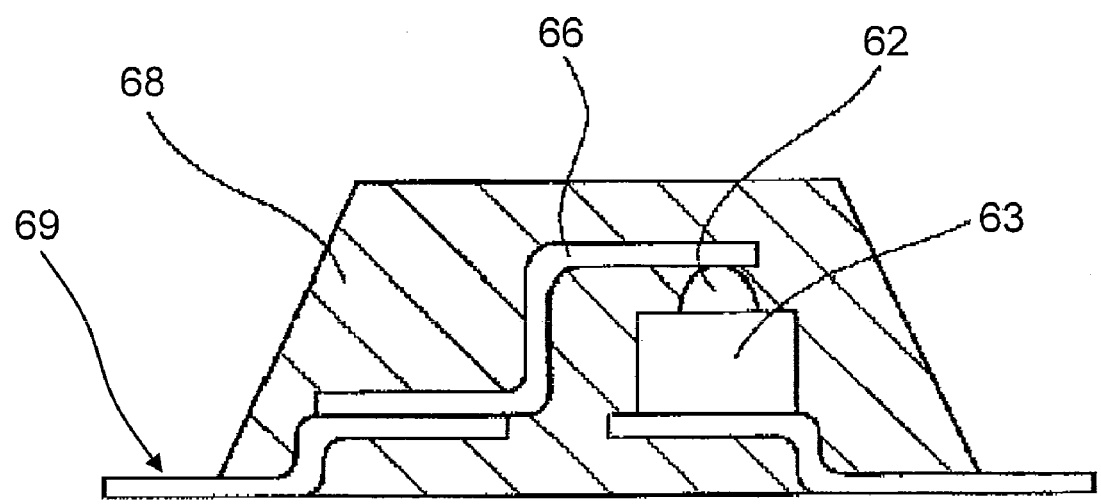
FIG. 6 is an outline sectional view of a semiconductor device according to another prior art.

FIG. 4D is a schematic sectional view of the power transistor 442.

The power transistor 442 includes a power device section 411, a gate electrode 410 and a source electrode 412 provided on a lower surface (a surface on the lead frame 441G side) of the power device section 411, and a drain electrode 409 provided over the whole upper surface (a surface on the lead frame 441A, 441B, 441C side) of the power device section 411.

A drain-use ohmic electrode 413, a source-use ohmic interconnection 414 and a gate-use ohmic electrode 415 are provided on the upper surface of the power device section 411. Also, a polyimide film 465 having a through hole 416 is provided between the upper surface of the power device section 411 and the drain electrode 409. Part of the drain electrode 409 is filled in the through hole 416, and the drain electrode 409 is connected to the drain-use ohmic electrode 413. It is noted that the power device section 411 is an example of the device main body, the drain-use ohmic electrode 413 is an example of the third electrode, and the polyimide film 465 is an example of a resin-made insulation film.

The power device section 411 is formed by performing epitaxial growth of a buffer layer 420, a GaN layer 421, and an AlGaN layer 422 on a Si substrate 419 with use of MOCVD. Through holes 423, 433 are provided in the power device section 411. Part of the source-use ohmic interconnection 414 is filled in the through hole 423, and the source electrode 412 is connected to the source-use ohmic interconnection 414. Also, part of the gate-use ohmic interconnection 434 is filled in the through hole 433, and the gate electrode 410 is connected to the gate-use ohmic electrode 415 via the gate-use ohmic interconnection 434.

The semiconductor device constructed as described above has effects similar to those of the first and second embodiments and moreover is enabled to reduce the interconnect inductance to about 0, allowing the surge due to parasitic inductance to be about 0.

Besides, mounting processes such as ordinary resin molding process may be performed also for the semiconductor device described above.

In all the first to fourth embodiments, Ag paste or other electroconductive resins may be used instead of solder, or solder may be used instead of Ag paste, or wire bonding of Al wire or Cu wire may be implemented instead of wire bonding of Au wire.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

REFERENCE SIGNS LIST 2, 102, 442 . . . power transistor
3, 223 . . . Cu chip
4 . . . Al wire 5, 335 . . . Au wire
6 . . . first lead
7 . . . second lead
8 . . . third lead
9, 409 . . . drain electrode
10, 410 . . . gate electrode
11, 411 . . . power device section
13, 413 . . . drain-use ohmic electrode
15, 465 . . . polyimide film
16, 27 . . . drain-use through hole
220, 331A, 331B, 331C, 331D, 331E, 331F, 331G, 331H, 331I,
331J, 441A, 441B, 441C, 441D, 441E, 441F, 441G . . . lead frame
332A . . . diode
332C . . . low-side control IC
332D . . . high-side control IC

The invention claimed is:

1. A semiconductor device comprising:
a first metal plate;
a semiconductor chip which is placed on the first metal plate and connected to the first metal plate and which has a first electrode on one side opposite to the first metal plate side;
a metal piece placed on the semiconductor chip and connected to the first electrode, wherein the metal piece covers less than the entire face of the first electrode to which the metal piece is connected;
a first interconnect portion having one end portion bonded to the metal piece; and
a second metal plate connected to the other end portion of the first interconnect portion.

2. The semiconductor device as claimed in claim 1, wherein
the semiconductor chip has a second electrode on one side opposite to the first metal plate side, the semiconductor device further comprising:
a second interconnect portion having one end portion connected to the second electrode; and
a third metal plate connected to the other end portion of the second interconnect portion, and wherein
a distance from a metal piece side surface of the semiconductor chip to a surface of the metal piece opposite to the semiconductor chip side is larger than a height of the second interconnect portion relative to the metal piece side surface of the semiconductor chip.

3. The semiconductor device as claimed in claim 2, wherein
the first metal plate, the second metal plate and the third metal plate are each part of a lead frame, and
a control IC for controlling the semiconductor chip and a diode electrically connected to the semiconductor chip are mounted on the lead frame.

4. The semiconductor device as claimed in claim 1, wherein
the semiconductor chip has:
a main body formed from a semiconductor;
a third electrode provided on a metal piece side surface of the main body;
an insulation film formed of resin and provided on the metal piece side surface of the main body;
a first through hole extending from a metal piece side surface of the insulation film up to the third electrode; and
an electroconductive member formed in the first through hole, wherein
the first electrode is provided on the insulation film and electrically connected to the third electrode via the electroconductive member in the first through hole.

5. The semiconductor device as claimed in claim 4, wherein
the semiconductor chip has:
an inorganic insulation film provided on the insulation film;
a second through hole extending from a metal piece side surface of the inorganic insulation film toward the third electrode and communicating with the first through hole; and
an electroconductive member formed in the second through hole, wherein
the first electrode is provided on the inorganic insulation film and electrically connected to the third electrode via the electroconductive members in the first and second through holes.

6. The semiconductor device as claimed in claim 1, wherein
the semiconductor chip includes a nitride semiconductor.

7. A semiconductor device manufacturing method for manufacturing the semiconductor device as claimed in claim 1, comprising the steps of:
placing the semiconductor chip on the first metal plate and connecting the semiconductor chip to the first metal plate;
placing the metal piece on the semiconductor chip and connecting the metal piece to the first electrode; and
connecting the metal piece and the second metal plate to each other via the first interconnect portion.

8. A semiconductor device manufacturing method for manufacturing a semiconductor device comprising:
a first metal plate;
a semiconductor chip which is placed on the first metal plate and connected to the first metal plate and which has a first electrode on one side opposite to the first metal plate side;
a metal piece placed on the semiconductor chip and connected to the first electrode, wherein the metal piece covers less than the entire face of the first electrode to which the metal piece is connected;
a first interconnect portion having one end portion connected to the metal piece; and
a second metal plate connected to the other end portion of the first interconnect portion,
the semiconductor device manufacturing method comprising the steps of:
placing the semiconductor chip on the first metal plate and connecting the semiconductor chip to the first metal plate;
placing the metal piece on the semiconductor chip and connecting the metal piece to the first electrode; and
connecting the metal piece and the second metal plate to each other via the first interconnect portion,
wherein the first interconnect portion is at least one wire, and the connection of the metal piece and the second metal plate to each other is implemented by wire bonding.

9. The semiconductor device as claimed in claim 1, wherein the first interconnect portion is at least one wire.

10. The semiconductor device as claimed in claim 1, wherein the first interconnect portion is a frame which is bonded to the metal piece.

11. The semiconductor device as claimed in claim 10, wherein said frame is bonded to the metal piece above the metal piece.

12. The semiconductor device as claimed in claim 10, wherein said frame has a surface above the metal piece, the surface being larger in area than an upper surface of the metal piece.

13. The semiconductor device as claimed in claim 1, wherein
   the semiconductor chip has a second electrode on one side opposite to the first metal plate side, the semiconductor device further comprising:
   a second interconnect portion having one end portion connected to the second electrode; and wherein
   a distance from a metal piece side surface of the semiconductor chip to a surface of the metal piece opposite to the semiconductor chip side is larger than a height of the second interconnect portion relative to the metal piece side surface of the semiconductor chip.

14. The semiconductor device as claimed in claim 1, wherein
   the first metal plate is part of a lead frame, and
   a control IC for controlling the semiconductor chip and a diode electrically connected to the semiconductor chip is mounted on the lead frame.

15. The semiconductor device as claimed in claim 1, wherein
   the second metal plate is part of a lead frame, and
   a control IC for controlling the semiconductor chip and a diode electrically connected to the semiconductor chip is mounted on the lead frame.

16. A semiconductor device comprising:
   a first metal plate;
   a semiconductor chip which is placed on the first metal plate and connected to the first metal plate and which has a first electrode on one side opposite to the first metal plate side;
   a metal piece placed on the semiconductor chip and connected to the first electrode;
   a first interconnect portion having one end portion connected to the metal piece, wherein said first interconnect portion is
      a wire, or
      a frame for which said one end portion is connected to the metal piece above the metal piece, and said frame has a surface above the metal piece, and said surface is larger in area than an upper surface of the metal piece; and
   a second metal plate connected to the other end portion of the first interconnect portion.

17. The semiconductor device as claimed in claim 16, wherein said first interconnect portion is a frame, said frame has a surface above the metal piece, and said surface is larger in area than an upper surface of the metal piece.

* * * * *